(12) United States Patent
Mehandru et al.

(10) Patent No.: US 11,923,412 B2
(45) Date of Patent: Mar. 5, 2024

(54) SUB-FIN LEAKAGE REDUCTION FOR TEMPLATE STRAINED MATERIALS

(71) Applicant: Intel Corporation, Santa Clara, CA (US)

(72) Inventors: Rishabh Mehandru, Portland, OR (US); Stephen Cea, Hillsboro, OR (US); Anupama Bowonder, Portland, OR (US); Juhyung Nam, Hillsboro, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/106,374

(22) Filed: Feb. 6, 2023

(65) Prior Publication Data

US 2023/0187492 A1 Jun. 15, 2023

Related U.S. Application Data

(62) Division of application No. 16/457,347, filed on Jun. 28, 2019, now Pat. No. 11,600,696.

(51) Int. Cl.
*H01L 23/00* (2006.01)
*H01L 29/06* (2006.01)
*H01L 29/423* (2006.01)
*H01L 29/66* (2006.01)
*H01L 29/78* (2006.01)

(52) U.S. Cl.
CPC ...... *H01L 29/0653* (2013.01); *H01L 29/0673* (2013.01); *H01L 29/42392* (2013.01); *H01L 29/66545* (2013.01); *H01L 29/66818* (2013.01); *H01L 29/7848* (2013.01); *H01L 29/7854* (2013.01)

(58) Field of Classification Search
CPC ............ H01L 29/0653; H01L 29/0673; H01L 29/42392
See application file for complete search history.

(56) References Cited

U.S. PATENT DOCUMENTS

2015/0255542 A1 9/2015 Cai

*Primary Examiner* — Anthony Ho
(74) *Attorney, Agent, or Firm* — Schwabe, Williamson & Wyatt, P.C.

(57) ABSTRACT

Embodiments disclosed herein include transistor devices and methods of forming such transistor devices. In an embodiment a transistor comprises a substrate, and a fin that extends up from the substrate. In an embodiment, the fin comprises a source region, a drain region, and a channel region between the source region and the drain region. In an embodiment, the transistor further comprises and a cavity in the fin, where the cavity is below the channel region. In an embodiment, the transistor further comprises a gate stack over the fin.

20 Claims, 14 Drawing Sheets

SUB-FIN LEAKAGE REDUCTION FOR TEMPLATE STRAINED MATERIALS

CROSS-REFERENCE TO RELATED APPLICATIONS

This application is a division of U.S. patent application Ser. No. 16/457,347, filed on Jun. 28, 2019, the entire contents of which is hereby incorporated by reference herein.

TECHNICAL FIELD

Embodiments of the disclosure are in the field of semiconductor structures and processing and, in particular, to sub-fin architectures that reduce leakage in non-planar transistors and methods of forming such devices.

BACKGROUND

The drive to smaller and more efficient transistor devices is not without issue. In non-planar transistors, it has been shown that sub-fin leakage is a significant problem. Sub-fin leakage occurs when the source/drain (S/D) regions extend below the active fin height when the gate dimension is relatively small, the extension is too deep, or both. In order to reduce the sub-fin leakage, a silicon on insulator (SIO) substrate may be used or an epitaxial undercut (EUC) may be kept below the active fin height. However, a shallow EUC results in increases in external resistance, and using an SOI substrate reduces the strain in the channel, which reduces channel mobility.

DESCRIPTION OF THE EMBODIMENTS

Figure 1A:
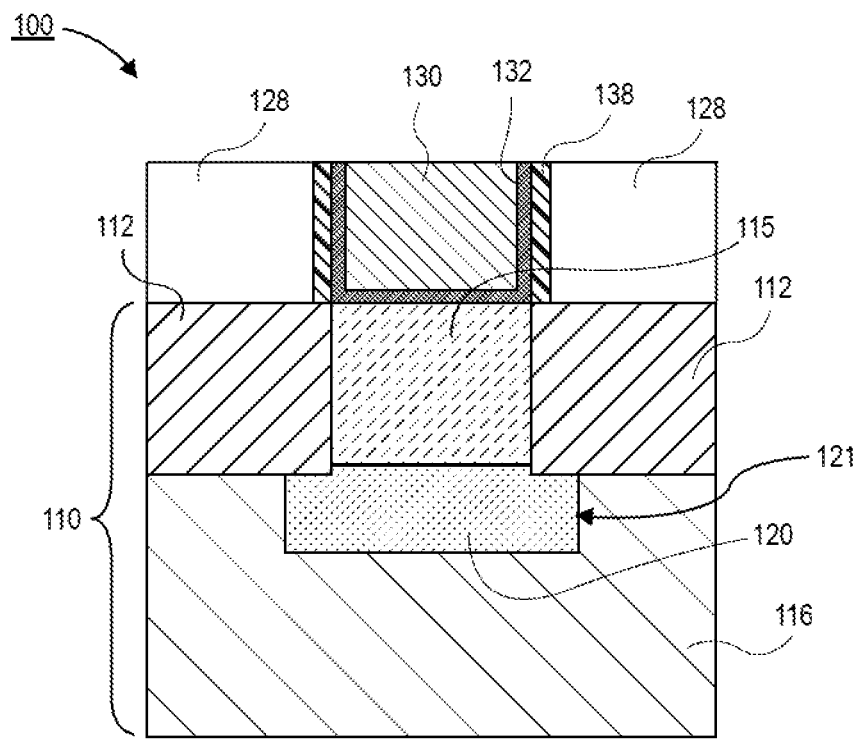
FIG. 1A is a cross-sectional illustration of a transistor across the gate stack that shows a cavity below the channel region, in accordance with an embodiment.

Embodiments described herein comprise to sub-fin architectures that reduce leakage in non-planar transistors and methods of forming such devices. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, sub-fin leakage is a critical concern as the industry is driving towards smaller and more efficient transistor devices. Accordingly, embodiments disclosed herein include insulating layers in a cavity between the channel region and the sub-fin structure. In an embodiment, the cavity is formed at a point in the manufacture of the transistor that allows for channel strain to be maintained. Particularly, the cavity is formed after the epitaxial deposition of the source and drain regions and while the gate stack spacers are present. As such, the elastic modulus of the structure is high and the stress is locked in. Accordingly, channel mobility is high while still providing reductions in sub-fin leakage.

Figure 1B:
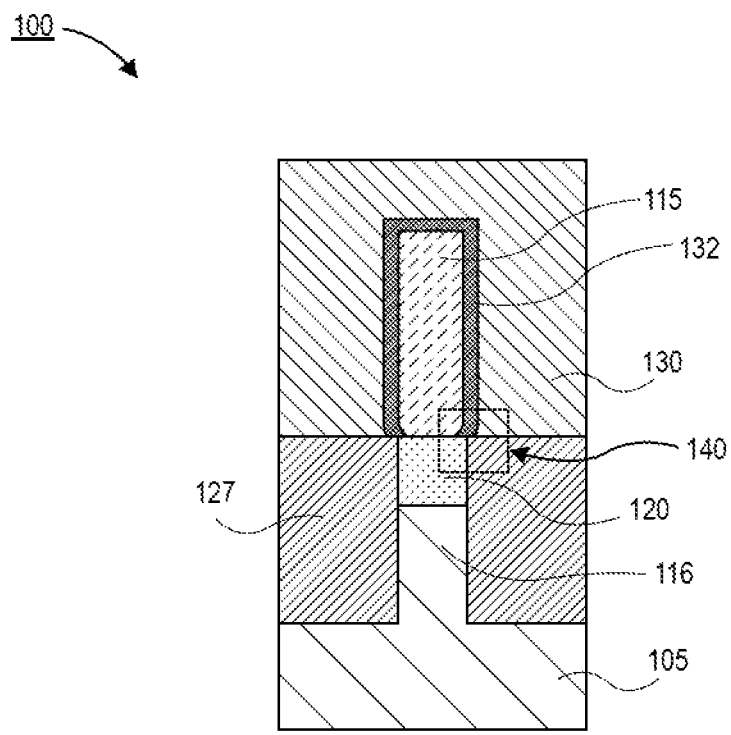
FIG. 1B is a cross-sectional illustration of the transistor in FIG. 1A across the fin, in accordance with an embodiment.
Figure 2A:
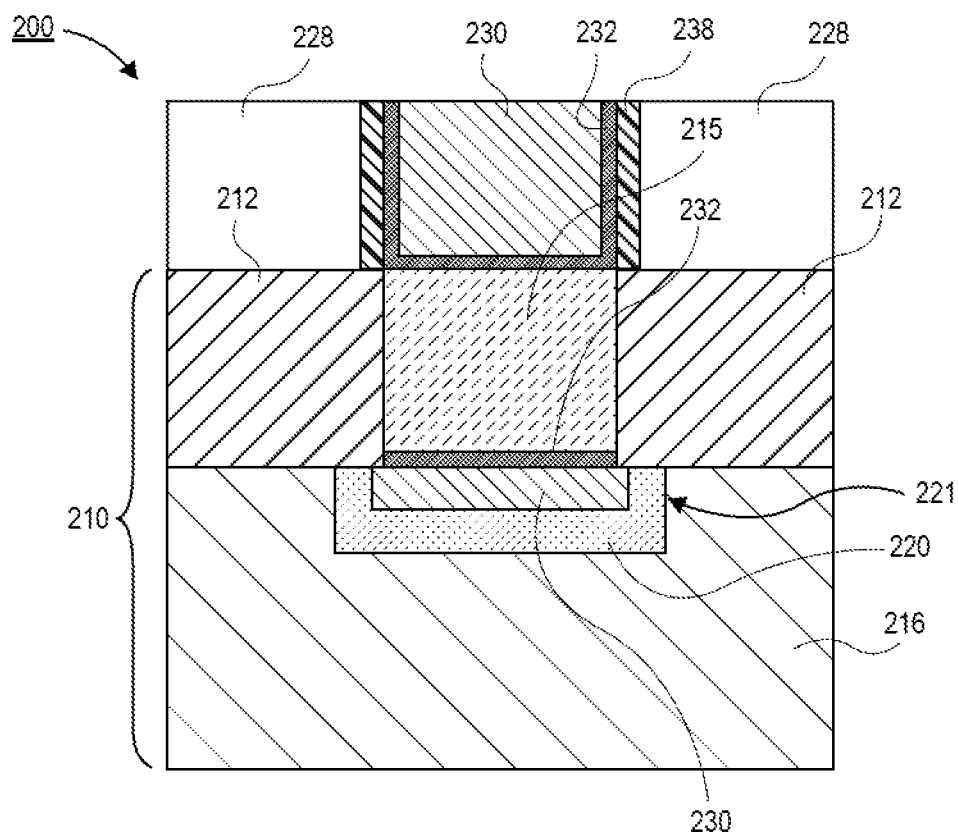
FIG. 2A is a cross-sectional illustration of a transistor across the gate stack that includes a gate all around (GAA) architecture, in accordance with an embodiment.
Figure 2B:
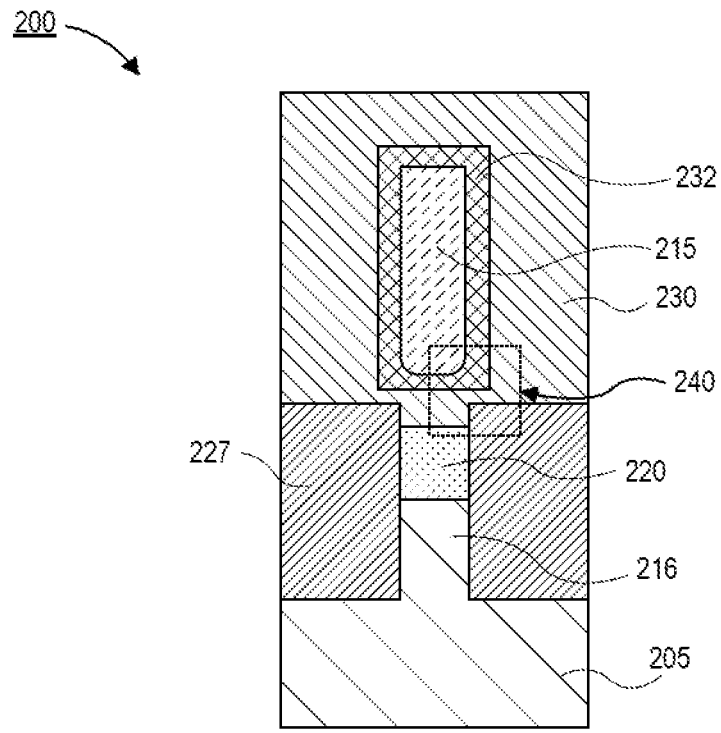
FIG. 2B is a cross-sectional illustration of the transistor in FIG. 2A across the fin, in accordance with an embodiment.
Figure 2C:
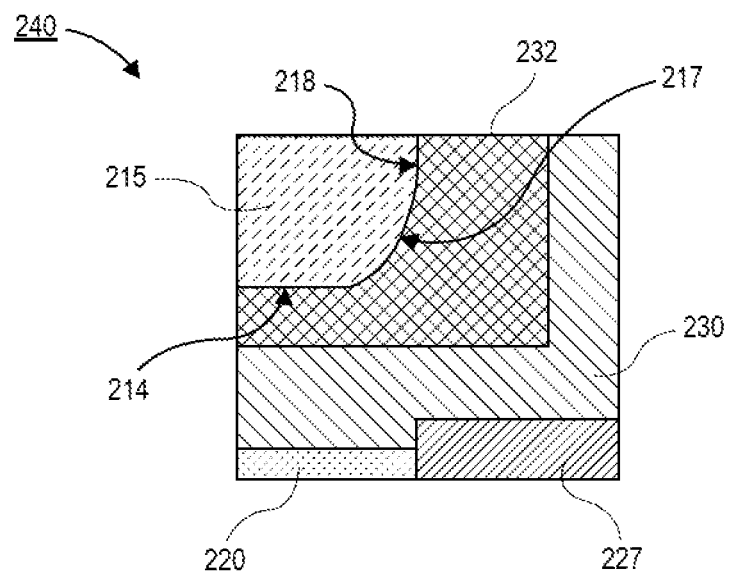
FIG. 2C is a zoomed in cross-sectional illustration of the highlighted region in FIG. 2B, in accordance with an embodiment.

Embodiments disclosed herein include non-planar transistors. As used herein, a "non-planar" transistor refers to a transistor in which the gate electrode is disposed over more than one surface of the channel region. For example, non-planar transistors may comprise tri-gate transistors (also referred to as fin-FET) transistors. In such embodiments, the gate electrode is disposed over a first sidewall surface, a second sidewall surface, and a topmost surface of the channel region. Such a tri-gate transistor 100 is illustrated in FIGS. 1A and 1B. Non-planar transistors may also comprise gate all around (GAA) transistors. GAA transistors include a gate electrode that wraps entirely around the surfaces of the channel region. For example, the gate electrode may be disposed over a first sidewall surface, a second sidewall surface, a bottommost surface, and a topmost surface of the channel region. Such a GAA transistor 200 is illustrated in FIGS. 2A-2C. Depending on the dimensions of the channel region, a GAA transistor 200 may sometimes also be referred to as a nanoribbon transistor or a nanowire transistor. While the non-planar transistors shown herein include tri-gate and GAA transistors, it is to be appreciated that many different non-planar transistors may be fabricated using similar processing operations. For example, the non-planar transistor may also include dual-gate transistors, or the like.

Referring now to FIGS. 1A and 1B, a pair of cross-sectional illustrations of a non-planar transistor is shown, in accordance with an embodiment. FIG. 1A provides a cross-sectional illustration of the non-planar transistor 100 across the gate stack, and FIG. 1B provides a cross-sectional illustration of the non-planar transistor 100 across the channel region 115 of the fin 110. In an embodiment, the transistor 100 may comprise a fin 110 that extends up from an underlying semiconductor substrate 105. In an embodiment, the underlying semiconductor substrate 105 represents a general workpiece object used to manufacture integrated circuits. The semiconductor substrate 105 often includes a wafer or other piece of silicon or another semiconductor material. Suitable semiconductor substrates 105 include, but are not limited to, single crystal silicon, polycrystalline silicon and silicon on insulator (SOI), as well as similar substrates formed of other semiconductor materials, such as substrates including germanium, carbon, or group III-V materials. The semiconductor substrate, depending on the stage of manufacture, often includes transistors, integrated circuitry, and the like. The substrate may also include semiconductor materials, metals, dielectrics, dopants, and other materials commonly found in semiconductor substrates.

In an embodiment, the fin 110 may comprise a sub-fin 116 and an active region over the sub-fin 116. The active region may comprise source/drain (S/D) regions 112 and a channel region 115 between the S/D regions 112. In an embodiment, the S/D regions 112 and the channel region 115 may be epitaxially grown over the sub-fin 116. The S/D regions 112 may have a different lattice constant than the channel region 115. The difference in the lattice constant may result in the channel region 115 being strained. This increases the mobility of the channel region 115. For example, the difference between the lattice constant of the channel region 115 and the lattice constant of the S/D regions 112 may be approximately 0.5% or greater, or approximately 1% or greater.

In a particular embodiment, the sub-fin 116 may be a material that can be selectively etched with respect to the channel region 115. For example, the sub-fin 116 may comprise silicon and the channel region 115 may comprise silicon and germanium (e.g., SiGe). The etch selectivity between the channel region 115 and the sub-fin 116 allows for a cavity 121 to be formed below the channel region 115. In an embodiment, the cavity 121 may be filled with an insulating material 120. As such, the bottom surface of the channel region 115 is electrically decoupled from the sub-fin 116 and leakage is reduced. In an embodiment, the insulating material 120 may be any suitable insulating material such as, but not limited to, oxides, nitrides, and oxynitrides. In an embodiment, the cavity 121 may also extend under portions of the S/D regions 112.

In an embodiment, the fin 110 may be surrounded by an isolation layer 127. The isolation layer 127 may provide isolation between neighboring fins (not shown). In an embodiment, the isolation layer 127 may be any suitable insulating material. For example, the isolation layer 127 may comprise silicon and oxygen (e.g., $SiO_2$).

In an embodiment, a gate stack may be disposed over the channel region 115. In an embodiment, the gate stack may comprise a gate dielectric 132 and a gate electrode 130. As shown in FIG. 1A, gate spacers 138 may also be formed along edges of the gate stack. The gate dielectric 132 may be disposed over a first sidewall, a second sidewall, and a top surface of the channel region 115. The gate electrode 130 may be disposed over the gate dielectric 132. Accordingly, the gate electrode 130 may wrap around a plurality of surfaces of the channel region 115. In an embodiment, an interlayer dielectric (ILD) 128 may surround the gate stack and be positioned over a top surface of the S/D regions 112.

The gate dielectric 132 may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. In the illustrated embodiment, the gate dielectric 132 is shown as a single material layer. However, it is to be appreciated that the gate dielectric 132 may comprise any number of layers. In some embodiments, the gate dielectric 132 may comprise an intrinsic semiconductor layer (not shown) between the channel region 115 and the high-k gate dielectric 132.

In an embodiment, the gate electrode 130 may comprise a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. In an embodiment, the gate electrode 130 may comprise a first conformal layer and a fill layer. Accordingly, while shown as a single material layer, it is to be appreciated that the gate electrode 130 may comprise any number of layers of different materials.

In an embodiment, processing operations used to form the transistor 100 may result in detectible artifacts in the final structure. For example, the bottom surface of the channel region 115 may have non-planar surfaces, as shown in region 140 of the transistor 100.

Figure 1C:
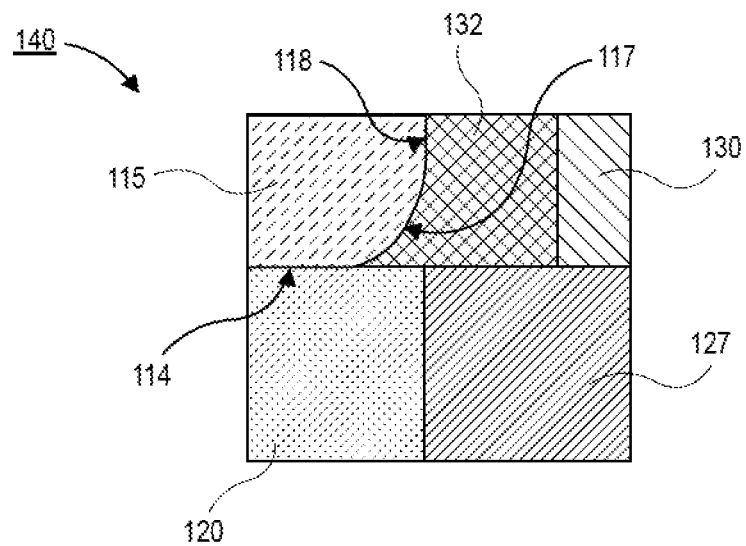
FIG. 1C is a zoomed in cross-sectional illustration of the highlighted region in FIG. 1B, in accordance with an embodiment.

Referring now to FIG. 1C, a zoomed in illustration of region 140 is shown, in accordance with an embodiment. In an embodiment, the region 140 more clearly depicts a bottom corner region of the channel region 115. As shown, a bottommost surface 114 of the channel region 115 may be coupled to a sidewall surface 118 of the channel region 115 by a curved surface 117. The curved surface 117 may be referred to as a rounded corner in some embodiments. In an embodiment, the curved surface 117 connects the substantially planar bottommost surface 114 to the substantially planar sidewall surface 118. In an embodiment, the bottommost surface 114 may be substantially parallel to a top surface of the substrate 105, and the sidewall surface 118 may be substantially orthogonal to the bottommost surface 114.

In an embodiment, the curved surface 117 may be an artifact of an etching process used to remove the sub-fin 116 below the channel region 115 to form the cavity 121. While the etching process is selective to the sub-fin 116, it is to be appreciated that some etching of the channel region 115 may occur and result in the curved surface 117. Furthermore, it is to be appreciated that the curved surface 117 may have any degree of curvature, depending on the etch selectivity between the sub-fin 116 and the channel region 115. That is, the curvature depicted in FIG. 1C is exemplary in nature.

In an embodiment, the sidewall surface 118 and the curved surface 117 of the channel region 115 may be covered by the gate dielectric 132. In an embodiment, the bottommost surface 114 of the channel region 115 may be directly contacted by the insulating material 120. In other embodiments, portions of the insulating material 120 may also directly contact portions (or all of) the curved surface 117.

Referring now to FIGS. 2A and 2B, a pair of cross-sectional illustrations of a non-planar transistor is shown, in accordance with an embodiment. FIG. 2A provides a cross-sectional illustration of the non-planar transistor 200 across the gate stack, and FIG. 2B provides a cross-sectional illustration of the non-planar transistor 200 across the channel region 215 of the fin 210. In an embodiment, the transistor 200 may be substantially similar to the transistor 100 described above with respect to FIGS. 1A-1C, with the exception that the transistor is a GAA transistor. That is, the transistor 200 may comprise a substrate 205, a fin 210 that comprises a sub-fin 216, S/D regions 212, a channel region 215, and a cavity 221 filled with an insulating material 220, and an isolation layer 227 around the fin.

In an embodiment, the gate stack may comprise a gate dielectric 232 and a gate electrode 230 between gate spacers 238. In an embodiment, the gate dielectric 232 and the gate electrode 230 may be substantially similar to the gate dielectric 132 and the gate electrode 130 described above, with the exception that the gate dielectric 232 and the gate electrode 230 wrap entirely around the channel region 215. For example, FIG. 2A shows the gate dielectric 232 and a portion of the gate electrode 230 below a bottommost surface of the channel region 215. In an embodiment, an interlayer dielectric (ILD) 228 may surround the gate stack and be positioned over a top surface of the S/D regions 212.

Particularly, as shown in the zoomed in illustration of region 240 in FIG. 2C, the gate dielectric 232 is in direct contact with a sidewall surface 218, the curved surface 217, and the bottommost surface 214. Additionally, the gate electrode 230 is shown below the bottommost surface 214 of the channel region 215. That is, the bottommost surface 214 of the channel region 215 may be separated from the insulating material 220 by a portion of the gate dielectric 232 and a portion of the gate electrode 230.

Referring now to FIGS. 3A-7B, a series of illustrations depicting a process for forming a non-planar transistor 300 is shown, in accordance with an embodiment. In an embodiment, the non-planar transistor 300 is a tri-gate transistor similar to the transistor 100 described above with respect to FIGS. 1A-1C.

Figure 3A:
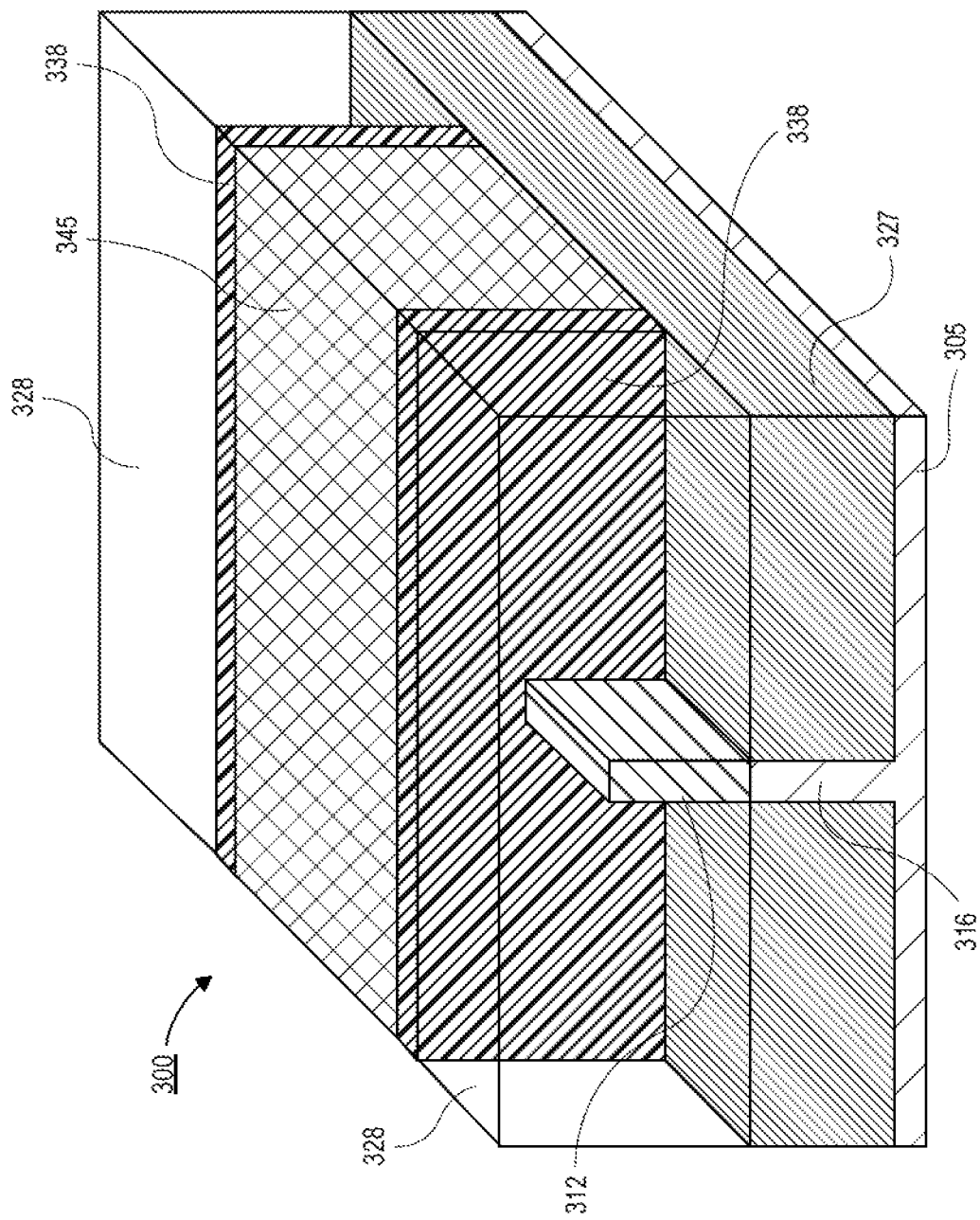
FIG. 3A is a perspective view illustration of a non-planar transistor with a dummy gate over the fin, in accordance with an embodiment.

Referring now to FIG. 3A, a perspective view illustration of a transistor 300 is shown, in accordance with an embodiment. In an embodiment, the transistor 300 may be disposed over a substrate 305. The transistor 300 may comprise a sub-fin 316 that extends up from the substrate 305. S/D regions 312 may be disposed over the sub-fin 316. Similarly, a channel region (not visible in FIG. 3A) may be disposed over the sub-fin 316 between the S/D regions 312. In an embodiment, a pair of gate spacers 338 may be disposed over the transistor 300 proximate to interfaces between the S/D regions 312 and the channel region. In an embodiment, a dummy electrode 345 may fill the space between the gate spacers 338. In an embodiment, the dummy electrode 345 may comprise polysilicon.

In an embodiment, an isolation layer 327 may surround the sub-fin 316. The isolation layer 327 may electrically isolate the transistor 300 from neighboring fins (not shown). In the illustrated embodiment the top surface of the isolation layer 327 is shown as being substantially coplanar with a top surface of the sub-fin 316. However, it is to be appreciated that in some embodiments, the top surface of the isolation layer 327 may be below a top surface of the sub-fin 316. In an embodiment, an interlayer dielectric (ILD) 328 may be disposed over the isolation layer. The ILD 328 may have a top surface that is substantially coplanar with a top surface of the gate spacers 338 and the top surface of the dummy electrode 345.

Figure 3B:
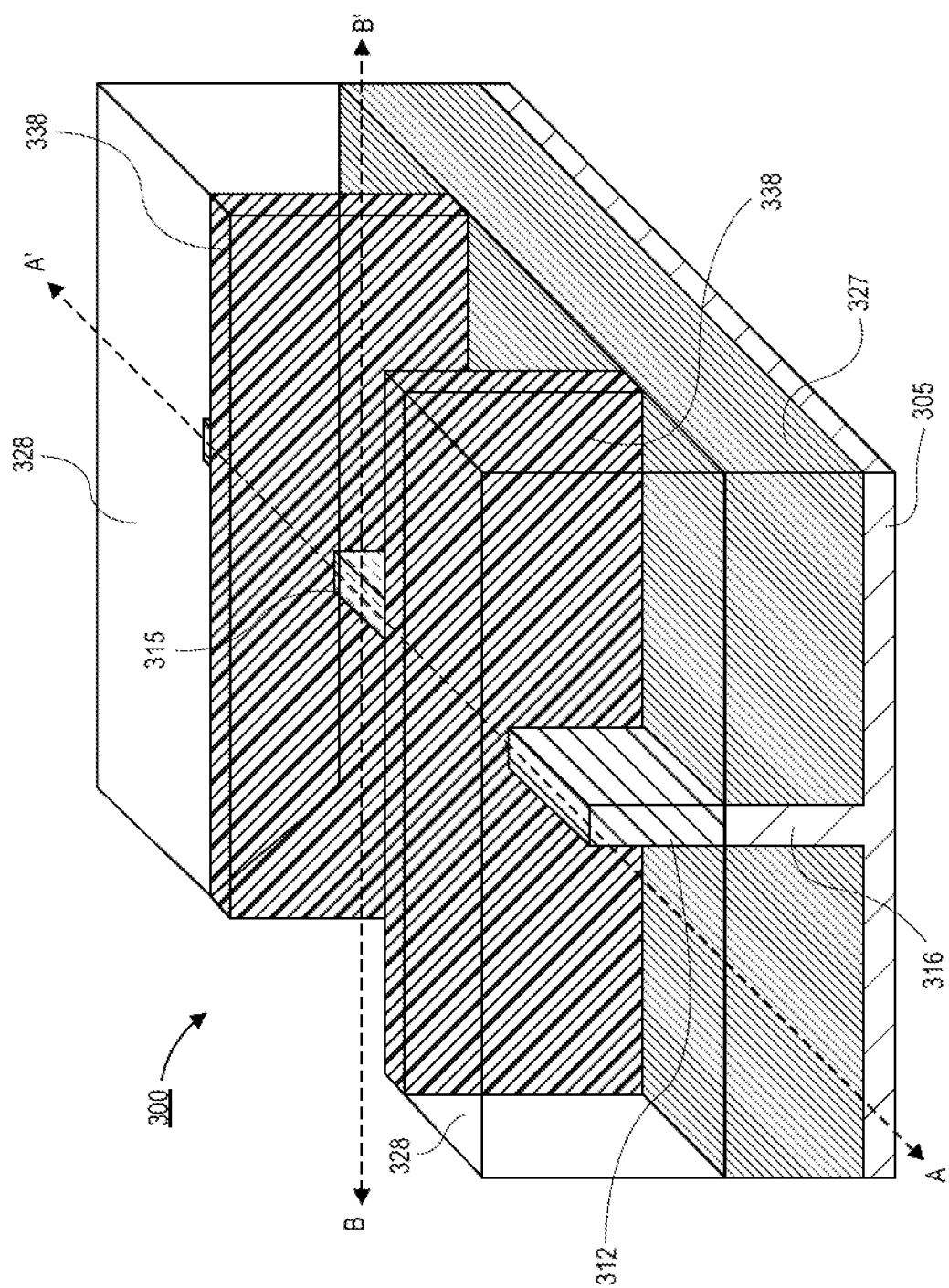
FIG. 3B is perspective view illustration of the non-planar transistor after the dummy gate electrode is remove to expose the channel region of the fin, in accordance with an embodiment.

Referring now to FIG. 3B, a perspective view illustration of the transistor 300 after the dummy electrode 345 is removed is shown, in accordance with an embodiment. Removal of the dummy electrode 345 exposes the channel region 315 between the gate spacers 338. As shown, the ILD 328 protects regions of the transistor 300 outside of the gate spacers 338. In FIG. 3B, lines A-A' and B-B' are shown. Line A-A' is along a cross-sectional plane that crosses the gate electrode and line B-B' is along a cross-sectional plane that crosses the fin in the channel region 315. In FIGS. 4A-7B, the "A" Figures are cross-sectional illustrations along the line A-A' at various stages of manufacture, and the "B" Figures are cross-sectional illustrations along the line B-B' at various stages of manufacture.

Figure 4A:
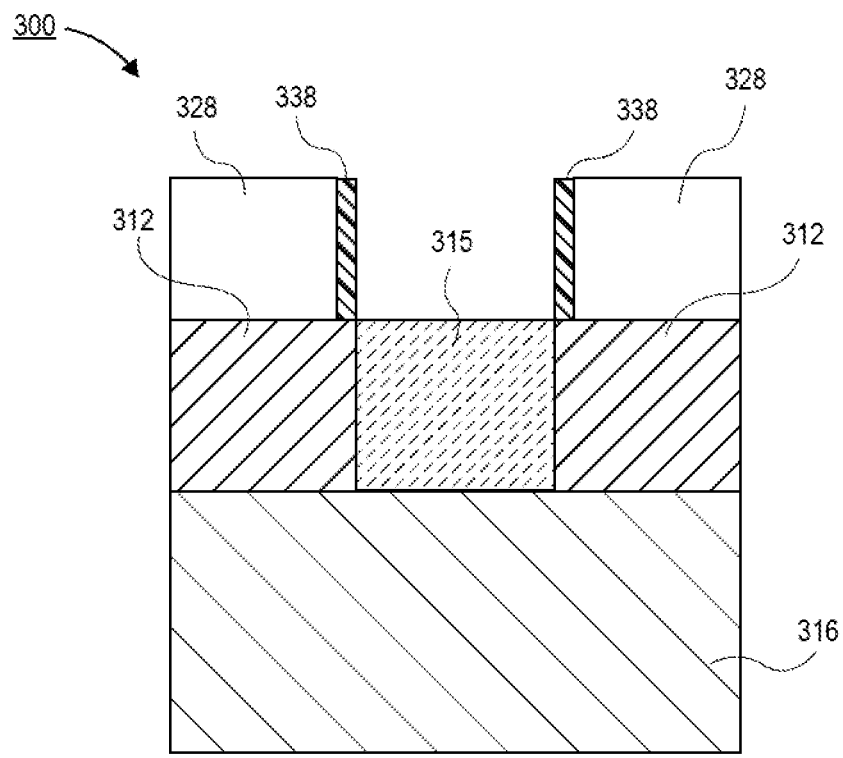
FIG. 4A is a cross-sectional illustration of the non-planar transistor in FIG. 3B along line A-A', in accordance with an embodiment.
Figure 4B:
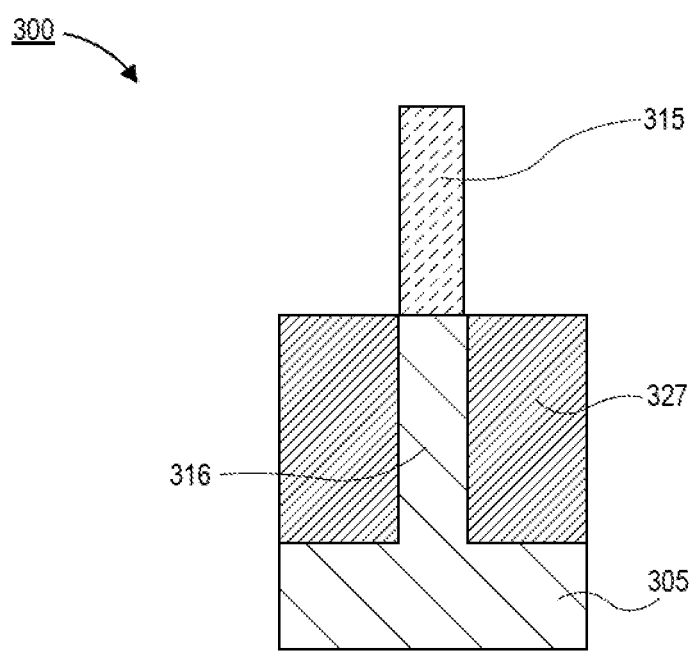
FIG. 4B is a cross-sectional illustration of the non-planar transistor in FIG. 3B along line B-B', in accordance with an embodiment.

Referring now to FIGS. 4A and 4B, a pair of cross-sectional illustrations of the transistor 300 is shown, in accordance with an embodiment. In an embodiment, the transistor 300 in FIGS. 4A and 4B are at the same stage of manufacture as shown in FIG. 3B. That is, the dummy electrode 345 has been removed in order to expose channel region 315.

Figure 5A:
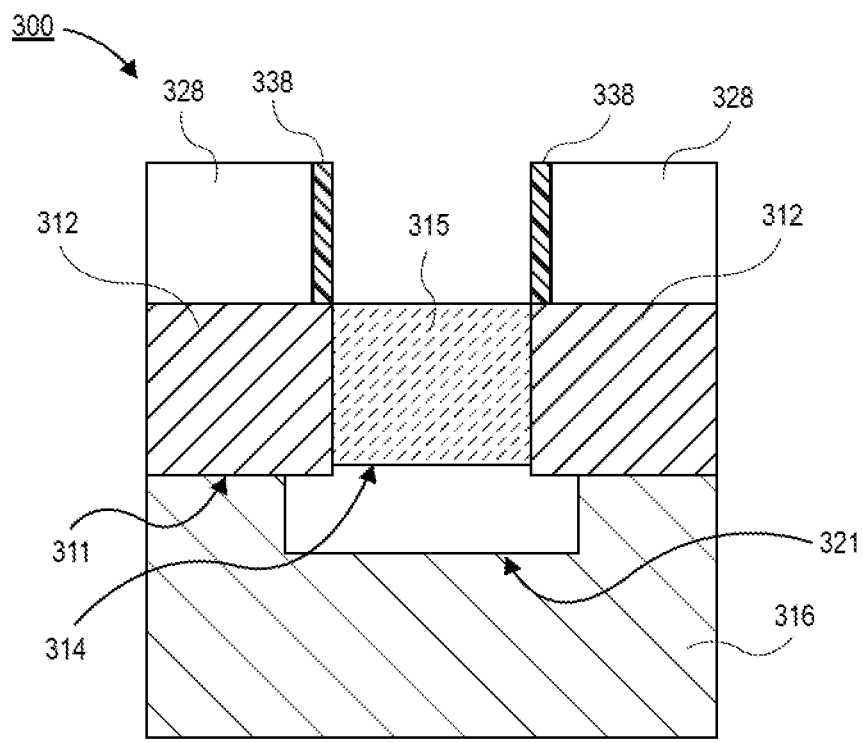
FIG. 5A is a cross-sectional illustration across the gate direction of the non-planar transistor after a cavity is formed below the channel region, in accordance with an embodiment.
Figure 5B:
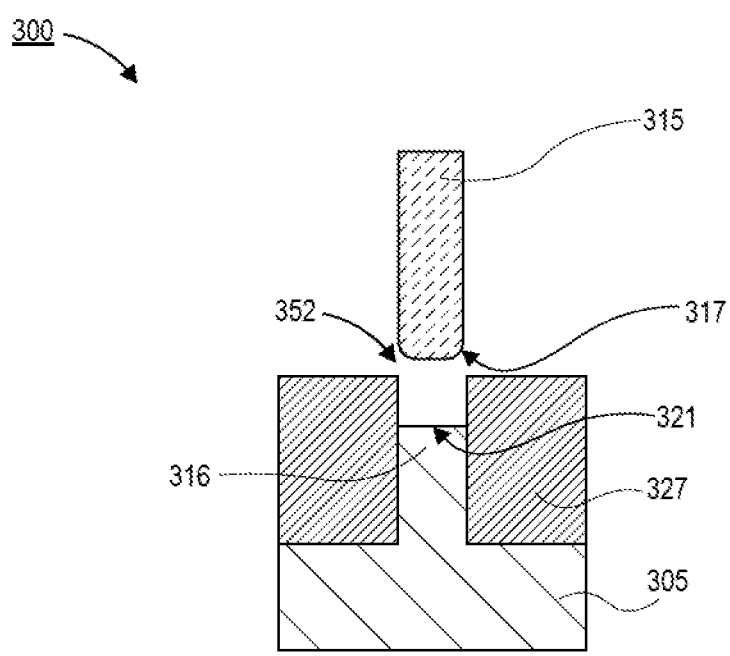
FIG. 5B is a cross-sectional illustration across the fin direction of the non-planar transistor after a cavity is formed below the channel region, in accordance with an embodiment.

Referring now to FIGS. 5A and 5B, a pair of cross-sectional illustrations of the transistor 300 after a cavity 321 is formed below the channel region 315 is shown, in accordance with an embodiment. In an embodiment, the cavity 321 may be formed by selectively etching the sub-fin 316 relative to the channel region 315. In some embodiments, the sub-fin 316 may be exposed by recessing the isolation layer 327 to provide a gap 352. In other embodiments, the isolation layer 327 may be recessed below a top surface of the sub-fin 316 in previous processing operations.

In an embodiment, the etching chemistry used to form the cavity 321 may not be 100% selective to the sub-fin 316 relative to the channel region 315. That is, in some embodiments, the channel region 315 may exhibit some etching. As such curved surfaces 317 (i.e., rounded corners) may be formed on the bottom corners of the channel region 315. As shown in FIG. 5A, the bottommost surface 314 of the channel region 315 may be etched back so that the bottommost surface 314 is above a bottommost surface 311 of the S/D regions 312 in some embodiments. In an embodiment, the channel region 315 may comprise silicon and germanium (e.g., SiGe), and the sub-fin 316 may comprise silicon.

In an embodiment, the etching process is an isotropic etching process. As such, the cavity 321 may extend below the gate spacers 338 and below portions of the S/D regions. While the cavity 321 is shown as being substantially rectangular, it is to be appreciated that in some embodiments the cavity 321 may have rounded surfaces and corners due to the isotropic nature of the etching chemistry.

It is to be appreciated that the strain within channel region 315 that arises from lattice constant mismatches is maintained after the formation of the cavity 321. Particularly, the elastic modulus of the transistor is maintained high due to the epitaxial growth of the S/D regions 312 and the presence of the gate spacers 338 and the ILD 328. According, strain built up in the channel region 315 is not substantially relieved by the removal of the underlying sub-fin 316. For example, approximately 80% or more of strain in the channel region 315 prior to removal of the sub-fin 316 may be maintained in the channel region 315 after removal of the sub-fin 316.

Figure 6A:
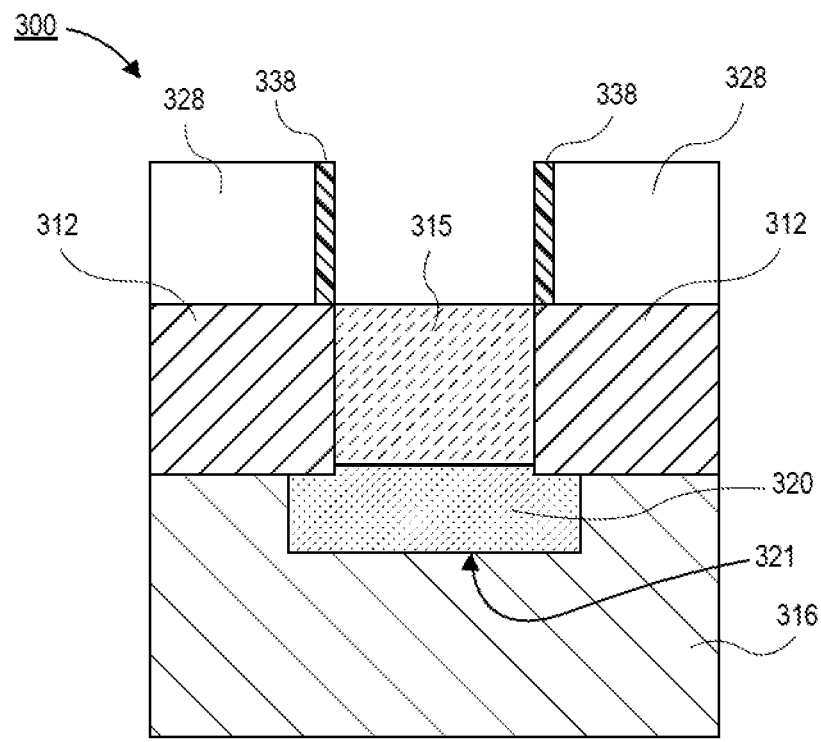
FIG. 6A is a cross-sectional illustration across the gate direction of the non-planar transistor after the cavity is filled with an insulating layer, in accordance with an embodiment.
Figure 6B:
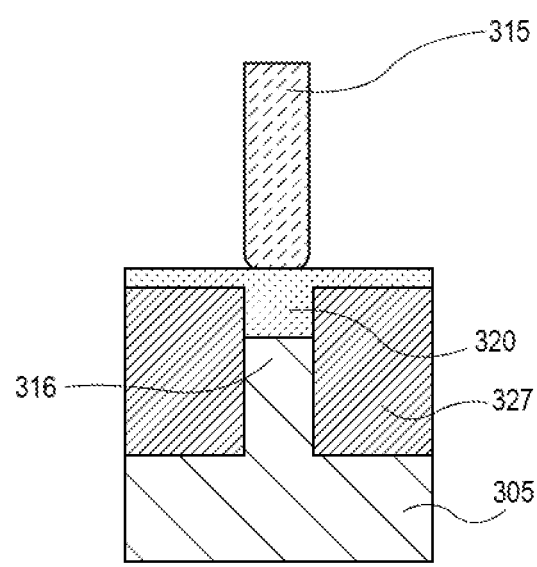
FIG. 6B is a cross-sectional illustration across the fin direction of the non-planar transistor after the cavity is filled with an insulating layer, in accordance with an embodiment.

Referring now to FIGS. 6A and 6B, a pair of cross-sectional illustrations of the transistor 300 after an insulating material 320 is disposed into the cavity 321 is shown, in accordance with an embodiment. In an embodiment, the insulating material 320 may be any suitable insulating material, such as, but not limited to an oxide, a nitride, or an oxynitride. In an embodiment, the insulating material 320 may entirely fill (or substantially fill) the cavity 321. In some embodiments, portions of the insulating material 320 may also be disposed over top surfaces of the isolation layer 327.

Figure 7A:
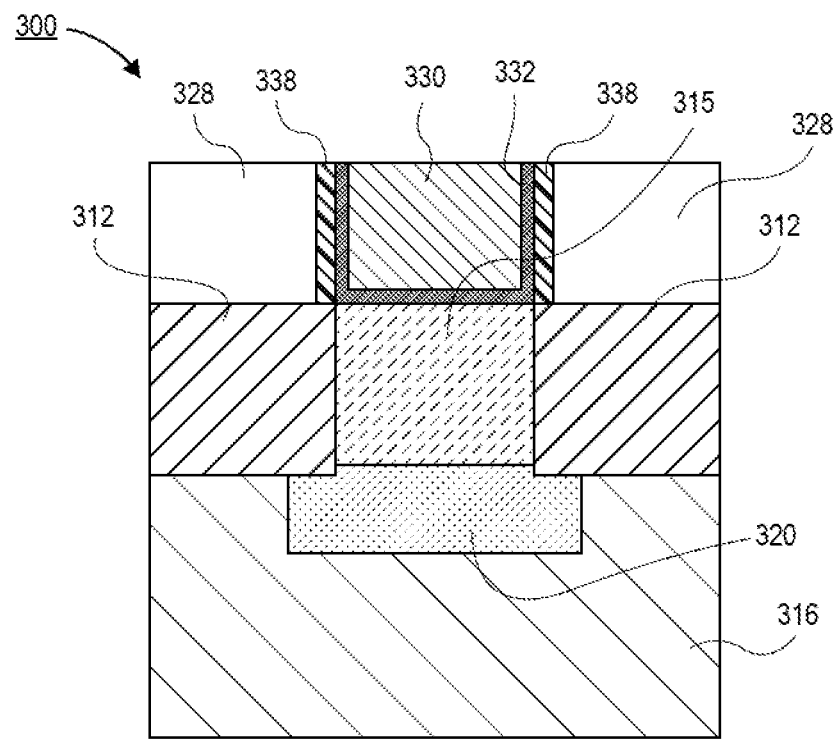
FIG. 7A is a cross-sectional illustration across the gate direction after the gate stack is formed, in accordance with an embodiment.
Figure 7B:
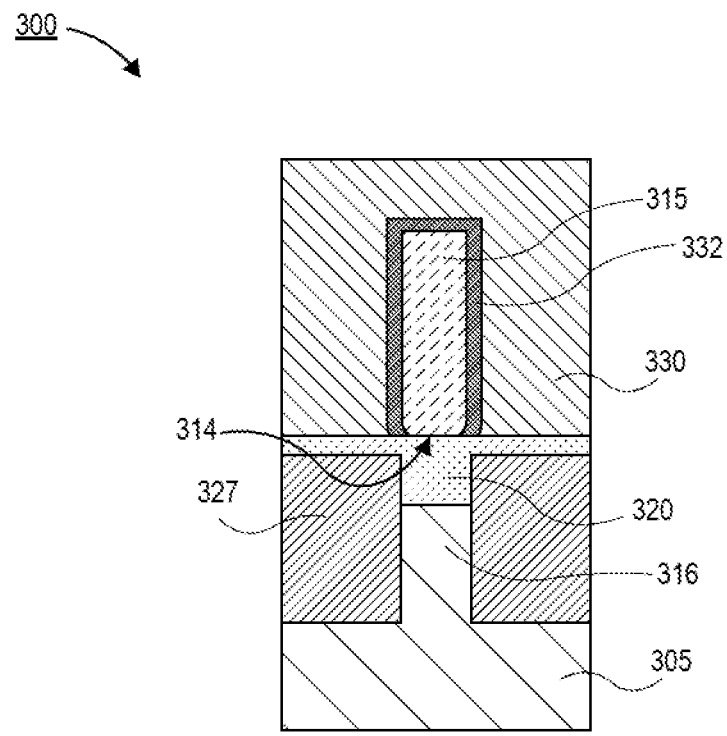
FIG. 7B is a cross-sectional illustration across the fin direction after the gate stack is formed, in accordance with an embodiment.

Referring now to FIGS. 7A and 7B, a pair of cross-sectional illustrations of the transistor 300 after the gate stack is formed is shown, in accordance with an embodiment. In an embodiment, the gate stack may comprise a gate dielectric 332 and a gate electrode 330. The gate dielectric 332 may wrap around a plurality of surfaces of the channel region 315. For example, the gate dielectric 332 may be disposed over a first sidewall, a second sidewall, and a top surface of the channel region 315. The gate electrode may be separated from the channel region 315 by the gate dielectric 332. That is, the gate stack may form a substantially U-shaped structure around the channel region 315. In an embodiment, the bottom surface 314 of the channel region 315 may be in direct contact with a surface of the insulating material 320.

Referring now to FIGS. 8A-10B, a series of cross-sectional illustrations depicting a process for forming a GAA transistor 300 that is substantially similar to the transistor 200 described above with respect to FIGS. 2A-2C is shown, in accordance with an embodiment.

Figure 8A:
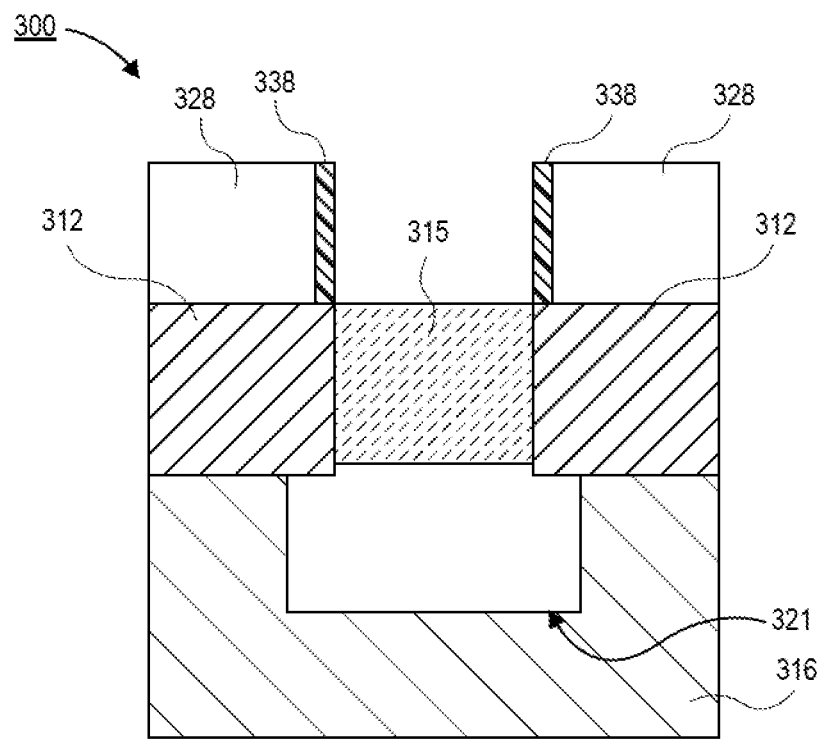
FIG. 8A is a cross-sectional illustration across the gate direction of the non-planar transistor after a cavity is formed below the channel region, in accordance with an embodiment.
Figure 8B:
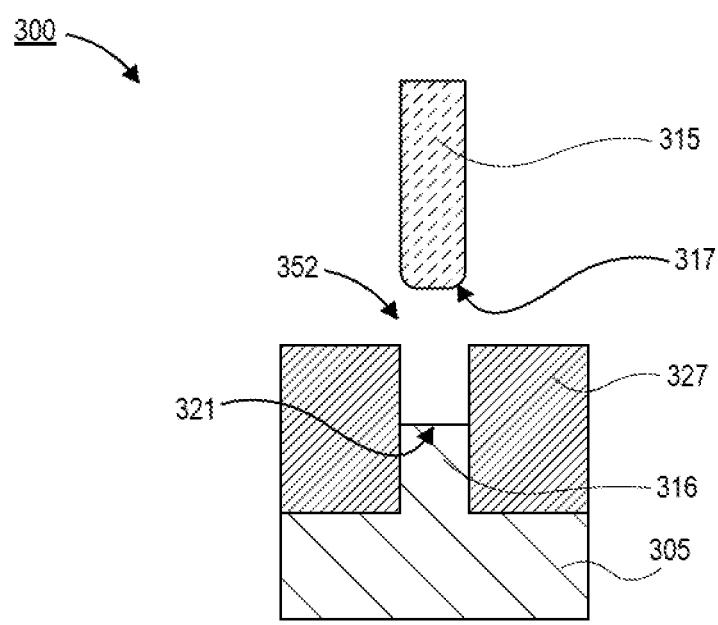
FIG. 8B is a cross-sectional illustration across the fin direction of the non-planar transistor after a cavity is formed below the channel region, in accordance with an embodiment.

Referring now to FIGS. 8A and 8B, a pair of cross-sectional illustrations of a transistor 300 after a cavity 321 is formed below the channel region 315 is shown, in accordance with an embodiment. In an embodiment, the structure in FIGS. 8A and 8B may be formed with substantially the same processes used to form the structure in FIGS. 5A and 5B. However, the depth of the cavity 321 into the sub-fin 316 may be increased to accommodate the subsequently disposed gate dielectric and gate electrode below the channel region 315.

Figure 9A:
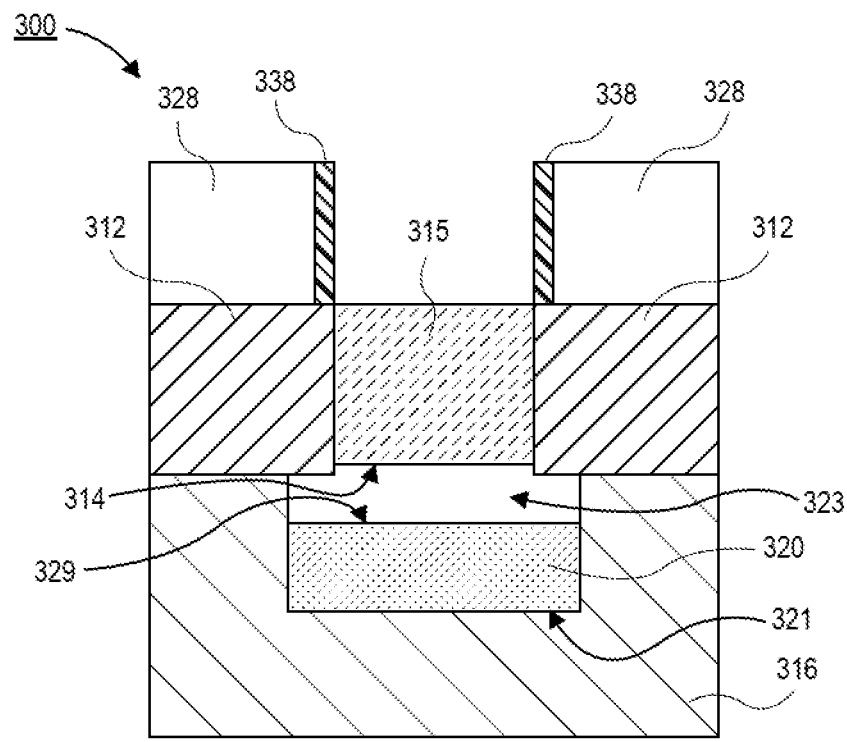
FIG. 9A is a cross-sectional illustration across the gate direction of the non-planar transistor after the cavity is filled with an insulating layer, in accordance with an embodiment.
Figure 9B:
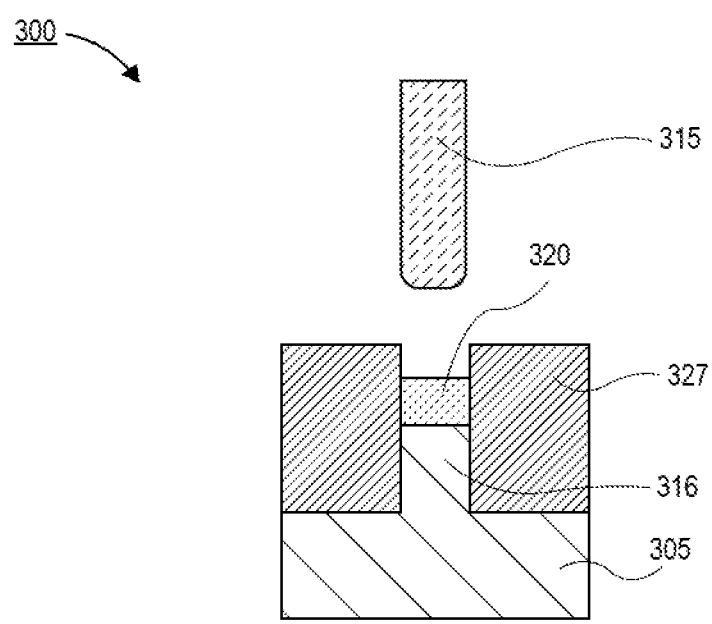
FIG. 9B is a cross-sectional illustration across the fin direction of the non-planar transistor after the cavity is filled with an insulating layer, in accordance with an embodiment.

Referring now to FIGS. 9A and 9B, a pair of cross-sectional illustrations of the transistor 300 after an insulating material 320 is disposed into the cavity 321 is shown, in accordance with an embodiment. In an embodiment, the insulating material 320 may be any suitable material, such as, but not limited to oxides, nitrides, or oxynitrides. In an embodiment, the cavity 321 is not entirely filled with the insulating material 320. That is, a space 323 is present between a bottom surface 314 of the channel region 315 and a top surface 329 of the insulating material 320.

Figure 10A:
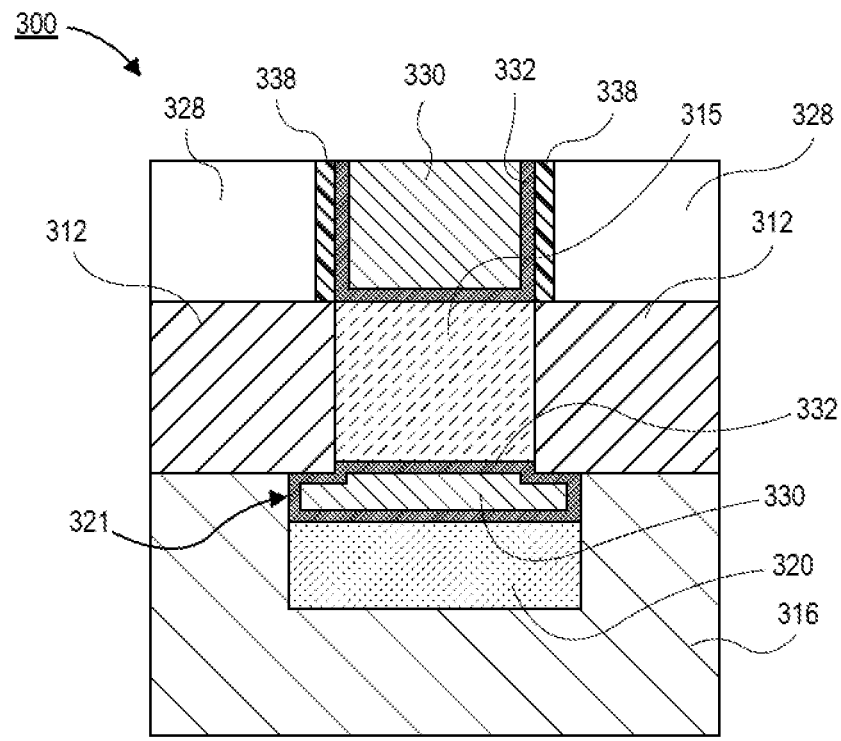
FIG. 10A is a cross-sectional illustration across the gate direction after the gate stack is formed, in accordance with an embodiment.
Figure 10B:
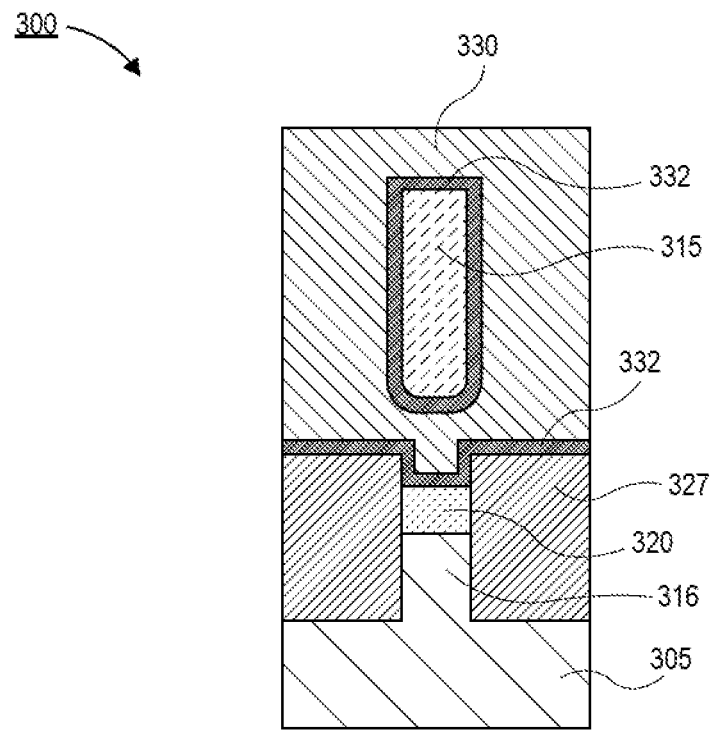
FIG. 10B is a cross-sectional illustration across the fin direction after the gate stack is formed, in accordance with an embodiment.

Referring now to FIGS. 10A and 10B, a pair of cross-sectional illustrations of the transistor 300 after a gate stack is disposed over the channel region is shown, in accordance with an embodiment. In an embodiment, the gate stack may comprise a gate dielectric 332 and a gate electrode 330. In an embodiment, the gate dielectric 332 and the gate electrode 330 may wrap entirely around a perimeter of the channel region 315, as shown in FIG. 10B. In an embodiment, the gate dielectric 332 may be disposed with a conformal deposition process. Accordingly, the gate dielectric 332 may also be disposed over the exposed top surface of the insulating material 320 and over a top surface of the isolation layer 327. For example, as shown in FIG. 10A, the remaining portion of the cavity 321 that is not filled by the insulating material 320 is lined by the gate dielectric 332 and filled by the gate electrode 330.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 11:
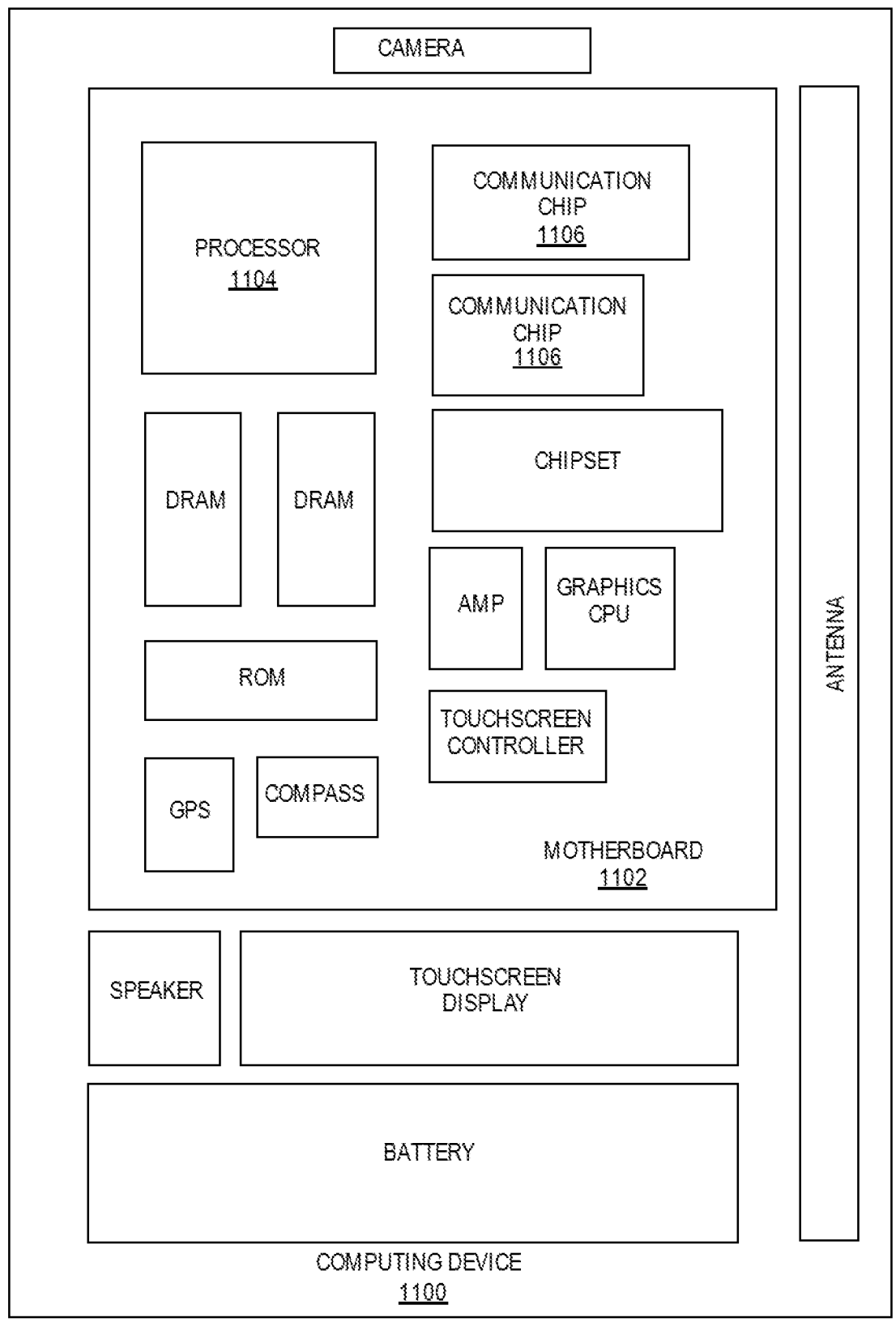
FIG. 11 illustrates a computing device in accordance with one implementation of an embodiment of the disclosure.

FIG. 11 illustrates a computing device 1100 in accordance with one implementation of an embodiment of the disclosure. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

Depending on its applications, computing device 1100 may include other components that may or may not be physically and electrically coupled to the board 1102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. In an embodiment, the integrated circuit die of the processor may comprise a non-planar transistor with a cavity below the channel region and sub-fin architecture, as described herein. The term "processor" may refer to any device or portion of a device that processes electronic data from registers and/or memory to transform that electronic data into other electronic data that may be stored in registers and/or memory.

The communication chip 1106 also includes an integrated circuit die packaged within the communication chip 1106. In an embodiment, the integrated circuit die of the communication chip may comprise a non-planar transistor with a cavity below the channel region and sub-fin architecture, as described herein.

In further implementations, another component housed within the computing device 1100 may comprise a non-planar transistor with a cavity below the channel region and sub-fin architecture, as described herein.

In various implementations, the computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Figure 12:
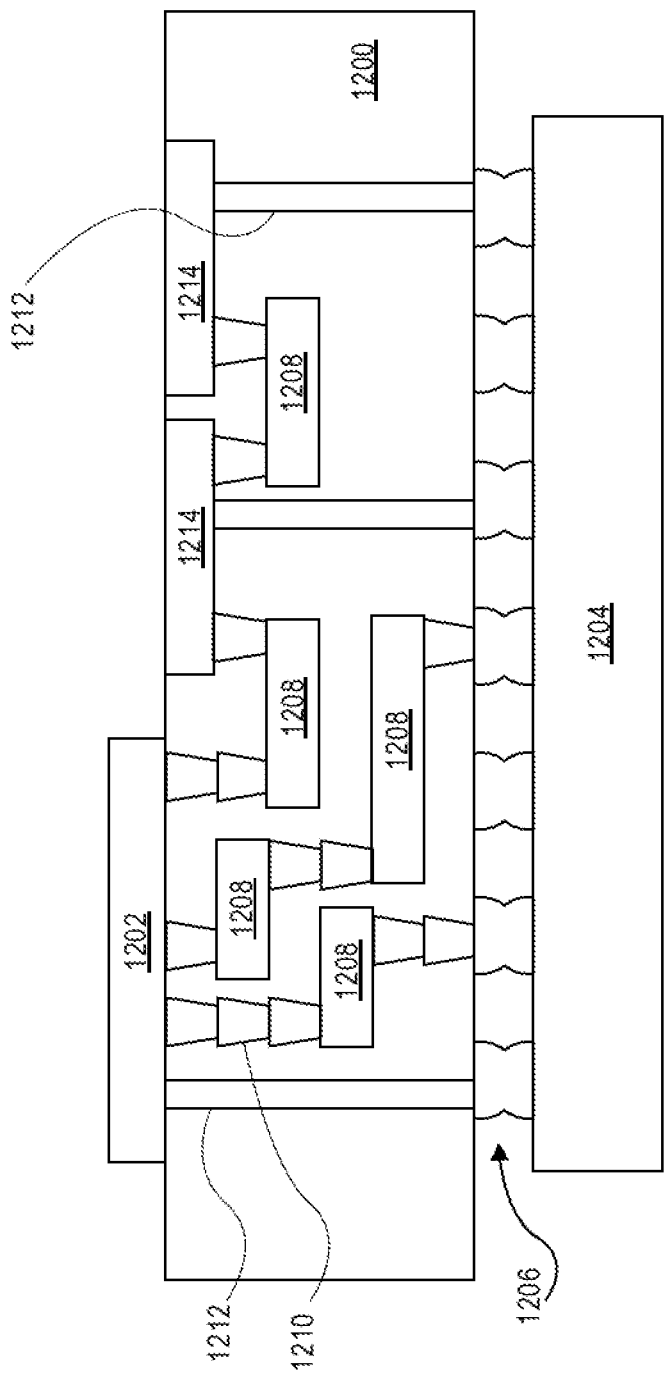
FIG. 12 is an interposer implementing one or more embodiments of the disclosure.

FIG. 12 illustrates an interposer 1200 that includes one or more embodiments of the disclosure. The interposer 1200 is an intervening substrate used to bridge a first substrate 1202 to a second substrate 1204. The first substrate 1202 may be, for instance, an integrated circuit die. The second substrate 1204 may be, for instance, a memory module, a computer motherboard, or another integrated circuit die. In an embodiment, one of both of the first substrate 1202 and the second substrate 1204 may a memory array that comprises bitcells with a binary alloy phase change material as the storage element, in accordance with embodiments described herein. Generally, the purpose of an interposer 1200 is to spread a connection to a wider pitch or to reroute a connection to a different connection. For example, an interposer 1200 may couple an integrated circuit die to a ball grid array (BGA) 1206 that can subsequently be coupled to the second substrate 1204. In some embodiments, the first and second substrates 1202/1204 are attached to opposing sides of the interposer 1200. In other embodiments, the first and second substrates 1202/1204 are attached to the same side of the interposer 1200. And in further embodiments, three or more substrates are interconnected by way of the interposer 1200.

The interposer 1200 may be formed of an epoxy resin, a fiberglass-reinforced epoxy resin, a ceramic material, or a polymer material such as polyimide. In further implementations, the interposer 1200 may be formed of alternate rigid or flexible materials that may include the same materials described above for use in a semiconductor substrate, such as silicon, germanium, and other group III-V and group IV materials.

The interposer 1200 may include metal interconnects 1208 and vias 1210, including but not limited to through-silicon vias (TSVs) 1212. The interposer 1200 may further include embedded devices 1214, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1200. In accordance with embodiments of the disclosure, apparatuses or processes disclosed herein may be used in the fabrication of interposer 1200.

Thus, embodiments of the present disclosure may comprise a non-planar transistor with a cavity below the channel region and sub-fin architecture, and the resulting structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a transistor, comprising: a substrate; a fin extending up from the substrate, wherein the fin comprises:

a source region; a drain region; and a channel region between the source region and the drain region; a cavity in the fin, wherein the cavity is below the channel region; and a gate stack over the fin.

Example 2: the transistor of Example 1, wherein the channel region comprises: a first sidewall surface; a second sidewall surface opposite the first sidewall surface; and a bottom surface, wherein a first corner between the first sidewall surface and the bottom surface is rounded, and wherein a second corner between the second sidewall surface and the bottom surface is rounded.

Example 3: the transistor of Example 2, wherein the gate stack covers the first sidewall surface of the fin, the second sidewall surface of the fin, and a top surface of the fin, wherein the top surface is opposite from the bottom surface.

Example 4: the transistor of Example 2, wherein the gate stack surrounds an entire perimeter of the channel region.

Example 5: the transistor of Examples 1-4, wherein the cavity is filled with an insulative material.

Example 6: the transistor of Example 5, wherein the insulative material is an oxide, a nitride, or an oxynitride.

Example 7: the transistor of Examples 1-6, wherein the cavity extends under the source region and the drain region.

Example 8: the transistor of Examples 1-7, wherein the gate stack comprises: a gate dielectric; and a gate electrode.

Example 9: the transistor of Example 8, wherein the gate stack further comprises: a first spacer proximate to a boundary between the source region and the channel region; and a second spacer proximate to a boundary between the drain region and the channel region.

Example 10: the transistor of Examples 1-9, further comprising: an isolation layer over the substrate and along sidewalls of the fin.

Example 11: the transistor of Example 10, wherein a topmost surface of the isolation layer is below a bottommost surface of the channel region.

Example 12: the transistor of Examples 1-10, wherein a lattice mismatch between the source region and the channel region and between the drain region and the channel region is approximately 0.5% or greater.

Example 13: the transistor of Example 12, wherein the channel region comprise silicon and germanium.

Example 14: a method of forming a transistor, comprising: forming a fin and a dummy gate over a substrate, wherein the fin comprises: a sub-fin layer; a source region over the sub-fin layer; a drain region over the sub-fin layer; a channel region over the sub-fin layer, wherein the channel region is between the source region and the drain region; and wherein the dummy gate comprises: a first spacer over the fin proximate to an interface between the source region and the channel region; a second spacer over the fin proximate to an interface between the drain region and the channel region; and a dummy gate electrode between the first spacer and the second spacer; exposing the channel region by removing the dummy gate electrode; selectively etching the sub-fin layer below the channel region to form a cavity; disposing an insulating material in the cavity; disposing a gate dielectric over the channel region; and disposing a gate electrode over the gate dielectric.

Example 15: the method of Example 14, wherein etching the sub-fin layer below the channel region rounds bottommost corners of the channel region.

Example 16: the method of Example 14 or Example 15, wherein the gate dielectric is disposed over a top surface of the channel region, a first sidewall surface of the channel region, and a second sidewall surface of the channel region.

Example 17: the method of Example 16, wherein the gate dielectric is disposed over a bottommost surface of the channel region.

Example 18: the method of Examples 14-17, wherein the insulating material is an oxide, a nitride, or an oxynitride.

Example 19: the method of Examples 14-18, wherein the cavity extends under the source region and the drain region.

Example 20: the method of Examples 14-19, wherein the channel region comprises silicon and germanium.

Example 21: the method of Examples 14-20, wherein a lattice mismatch between the source region and the channel region and between the drain region and the channel region is approximately 0.5% or greater.

Example 22: the method of Examples 14-21, wherein a lattice mismatch between the source region and the channel region and between the drain region and the channel region is approximately 0.5% or greater, and wherein a lattice mismatch between the channel region and the substrate is approximately 0.5% or less.

Example 23: an electronic system, comprising: a board; an electronic package electrically coupled to the board; and a semiconductor die electrically coupled to the electronic package, wherein the semiconductor die comprises: a non-planar transistor, wherein the non-planar transistor comprises: a channel region between a source region and a drain region; a cavity in below the channel region; and a gate stack over at least a first surface and a second surface of the channel region.

Example 24: the electronic system of Example 23, wherein the non-planar transistor is a tri-gate transistor.

Example 25: the electronic system of Example 23, wherein the non-planar transistor is a gate all around (GAA) transistor.

What is claimed is:

1. A method of forming a transistor, comprising:
    forming a fin and a dummy gate over a substrate, wherein the fin comprises:
        a sub-fin layer;
        a source region over the sub-fin layer;
        a drain region over the sub-fin layer;
        a channel region over the sub-fin layer, wherein the channel region is between the source region and the drain region; and
    wherein the dummy gate comprises:
        a first spacer over the fin proximate to an interface between the source region and the channel region;
        a second spacer over the fin proximate to an interface between the drain region and the channel region; and
        a dummy gate electrode between the first spacer and the second spacer;
    exposing the channel region by removing the dummy gate electrode;
    selectively etching the sub-fin layer below the channel region to form a cavity;
    disposing an insulating material in the cavity;
    disposing a gate dielectric over the channel region; and
    disposing a gate electrode over the gate dielectric.

2. The method of claim 1, wherein etching the sub-fin layer below the channel region rounds bottommost corners of the channel region.

3. The method of claim 1, wherein the gate dielectric is disposed over a top surface of the channel region, a first sidewall surface of the channel region, and a second sidewall surface of the channel region.

4. The method of claim 3, wherein the gate dielectric is disposed over a bottommost surface of the channel region.

5. The method of claim 1, wherein the insulating material is an oxide, a nitride, or an oxynitride.

6. The method of claim 1, wherein the cavity extends under the source region and the drain region.

7. The method of claim 1, wherein the channel region comprises silicon and germanium.

8. The method of claim 1, wherein a lattice mismatch between the source region and the channel region and between the drain region and the channel region is approximately 0.5% or greater.

9. The method of claim 1, wherein a lattice mismatch between the source region and the channel region and between the drain region and the channel region is approximately 0.5% or greater, and wherein a lattice mismatch between the channel region and the substrate is approximately 0.5% or less.

10. A method of fabricating a transistor, the method comprising:
   forming a fin extending up from a substrate, wherein the fin comprises:
      a source region;
      a drain region; and
      a channel region between the source region and the drain region;
   forming a cavity in the fin, wherein the cavity is below the channel region; and
   forming a gate stack over the fin.

11. The method of claim 10, wherein the channel region comprises:
   a first sidewall surface;
   a second sidewall surface opposite the first sidewall surface; and
   a bottom surface, wherein a first corner between the first sidewall surface and the bottom surface is rounded, and wherein a second corner between the second sidewall surface and the bottom surface is rounded.

12. The method of claim 11, wherein the gate stack covers the first sidewall surface of the fin, the second sidewall surface of the fin, and a top surface of the fin, wherein the top surface is opposite from the bottom surface.

13. The method of claim 11, wherein the gate stack surrounds an entire perimeter of the channel region.

14. The method of claim 10, wherein the cavity is filled with an insulative material.

15. The method of claim 14, wherein the insulative material is an oxide, a nitride, or an oxynitride.

16. The method of claim 10, wherein the cavity extends under the source region and the drain region.

17. The method of claim 10, wherein forming the gate stack comprises:
   forming a gate dielectric; and
   forming a gate electrode.

18. The method of claim 10, further comprising:
   forming an isolation layer over the substrate and along sidewalls of the fin.

19. The method of claim 18, wherein a topmost surface of the isolation layer is below a bottommost surface of the channel region.

20. The method of claim 10, wherein a lattice mismatch between the source region and the channel region and between the drain region and the channel region is approximately 0.5% or greater.

* * * * *